United States Patent [19]

Ohtani

[11] Patent Number: 4,636,912

[45] Date of Patent: Jan. 13, 1987

[54] CIRCUIT FOR CONTROLLING SOLENOID CLUTCH

[75] Inventor: Yoshio Ohtani, Higashimatsuyama, Japan

[73] Assignee: Diesel Kiki Company, Ltd., Japan

[21] Appl. No.: 690,745

[22] Filed: Jan. 11, 1985

[30] Foreign Application Priority Data

Jan. 12, 1984 [JP] Japan .................................. 59-2638
Jan. 12, 1984 [JP] Japan .................................. 59-2639

[51] Int. Cl.⁴ .............................................. H01F 7/18
[52] U.S. Cl. ............................... 361/154; 192/3.56; 361/196; 361/203
[58] Field of Search ............... 361/152, 153, 154, 195, 361/196, 203; 192/0.075, 3.56, 21.5, 0.03

[56] References Cited

U.S. PATENT DOCUMENTS

| 3,046,470 | 7/1962 | Blocher, Jr. .................... 361/152 X |
| 4,206,613 | 6/1980 | Shockley ....................... 192/0.03 X |
| 4,377,223 | 3/1983 | Sakakiyama et al. ............ 192/52 X |
| 4,509,091 | 4/1985 | Booth ........................... 192/3.56 X |

Primary Examiner—Michael L. Gellner
Attorney, Agent, or Firm—Guy W. Shoup

[57] ABSTRACT

A circuit for controlling a solenoid clutch wherein a gap is present between an electromagnet and an associated attracted member when in the disengaged state. The circuit controls the level of exciting current supplied to an exciting coil of the solenoid clutch in such a way that the width of the gap is first reduced to zero and then the slip rate of the solenoid clutch is gradually changed from 1 to 0, whereby the solenoid clutch gradually reaches the completely engaged state, making it possible to smoothly engage the solenoid clutch without the occurrence of mechanical shock.

9 Claims, 10 Drawing Figures

CIRCUIT FOR CONTROLLING SOLENOID CLUTCH

BACKGROUND OF THE INVENTION

The present invention relates to a circuit for controlling a solenoid clutch, and more particularly to a solenoid clutch controlling circuit for controlling a solenoid clutch wherein a gap is present between an electromagnet and an associated attracted member when in the disengaged state so as to cause the solenoid clutch to engage without shock.

A solenoid clutch wherein a gap is present between an electromagnet and an associated attracted member when in the disengaged state is used, for example, in auxiliary devices connected with engines, one example being the car air conditioner. Since such a solenoid clutch is completely engaged in a single action at the time of the application of an exciting current, a large mechanical shock occurs on both the driving and driven sides of the solenoid clutch so that the service life of the clutch and the associated apparatus are shortened and the engaging operation of the solenoid clutch is not smooth. To solve these drawbacks, the applicant proposed a circuit for controlling a solenoid clutch for a compressor in which the pulse width of a driving pulse applied thereto at the time of the start of the solenoid clutch is made gradually wider so as to gradually operate the compressor (Japanese Patent Public Disclosure No. 191326/58).

However, although the proposed controlling circuit is effective for a solenoid clutch having no such gap, the proposed control circuit cannot eliminate the mechanical shock at the time of engaging a solenoid clutch which has a gap between an electromagnet and an associated attracted member when in the disengaged state. Since the electromagnetic attracting force acting between the electromagnet and the associated attracted member is inversely proportional to the square of the gap width therebetween, even if the level of the exciting current is gradually increased by the gradual increase of the pulse width of the driving pulse for driving the solenoid clutch, the solenoid clutch is instantly engaged when the level of the exciting current reaches the value at which the attracted member starts to move under the attractive force of the electromagnet.

SUMMARY OF THE INVENTION

It is an object of the present invention to provide an improved circuit for controlling a solenoid clutch, which is capable of eliminating the drawbacks of the conventional solenoid clutch control circuit.

It is another object of the present invention to provide a circuit for controlling a solenoid clutch wherein a gap is present between an electromagnet and an associated attracted member when in the disengaged state so as to cause the solenoid clutch to engage without mechanical shock.

According to the present invention, in a circuit for controlling a solenoid clutch which includes an electromagnet and has an input side rotating member and an associated output side rotating member to be engaged with the input side rotating member, the input side rotating member and the output side rotating member being separated by a gap when the solenoid clutch is in the completely disengaged state, the circuit comprises a first means for producing at least one command signal for commanding the start of the engagement of the solenoid clutch and a second means responsive to the command signal for providing an exciting current for said electromagnet whose level is changed in such a way that the width of the gap is first reduced to zero (the state of 100% slipping contact between the input and output side rotating members) and then the slip rate of said solenoid clutch is gradually changed from 1 to 0.

The second means may comprise means responsive to the command signal for producing a first signal for supplying to the electromagnet the exciting energy necessary for reducing the width of the gap to zero and means for supplying to the electromagnet a second signal for exciting the electromagnet in such a way that the width of the gap is maintained at zero at the time the application of the exciting energy by the first signal is terminated and thereafter the attractive force of the electromagnet is increased with the passage of time.

With this arrangement, when the engagement of the solenoid clutch is commanded, at first, the electromagnet is excited so as to reduce the width of the gap to zero (state of full slipping contact), and then the exciting energy supplied to the solenoid clutch is gradually increased from the level necessary and sufficient for maintaining the width of the gap at zero so as to gradually realize the completely engaged state. As a result, a solenoid clutch which has a gap between an electromagnet and an associated attracted member when in the disengaged state can be controlled so as to engage without mechanical shock.

The present invention will be better understood and the other objects and advantages thereof will be more apparent from the following detailed description of preferred embodiments with reference to the accompanying drawings.

DESCRIPTION OF THE PREFERRED EMBODIMENTS

Figure 1:
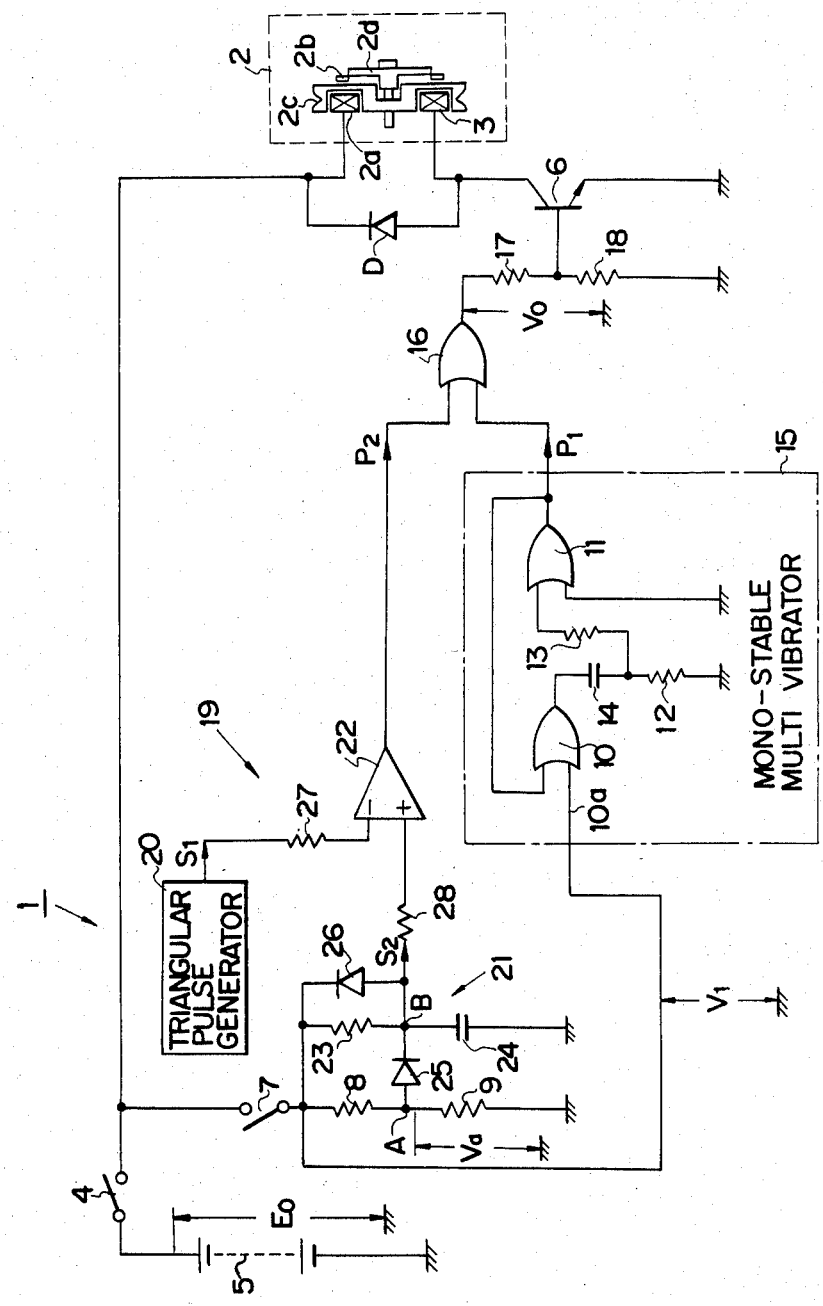
FIG. 1 is a circuit diagram of an embodiment of a circuit for controlling a solenoid clutch according to the present invention, including a schematic view of a solenoid clutch.

FIG. 1 shows an embodiment of a controlling circuit for a solenoid clutch according to the present invention. The controlling circuit, denoted by reference numeral 1, is a circuit for controlling a solenoid clutch 2, in which an electromagnet 2a and an associated magnetic plate 2b are separated by a gap of a predetermined width when the solenoid clutch 2 is in the completely disengaged state, so as to engage it without mechanical shock. The solenoid clutch 2 has an input roller 2c on which the electromagnet 2a is mounted and a output roller 2d on which the magnetic plate 2b is mounted. A part of the input roller 2c is used as a magnetic path for the electromagnet 2a and the magnetic plate 2b is electromagnetically attracted to the part of the input roller 2c when the electromagnet 2a is fully excited. While the magnetic plate 2b is separated from the input roller 2c at the time the electromagnet 2a is deenergized, a gap of a predetermined width is formed between the magnetic plate 2b and the corresponding part of the input roller 2c, that is, the electromagnet 2a.

One end of an exciting coil 3 of the electromagnet 2a is connected through a power switch 4 to the positive terminal of a battery 5 and the other end of the coil 3 is connected to the collector of a transistor 6, the emitter of which is grounded.

One terminal of a start switch 7 is connected through the power switch 4 to the battery and the other terminal of the start switch 7 is grounded through resistors 8 and 9. The start switch 7 and the resistors 8 and 9 constitute a circuit for producing a start signal used for starting the engaging operation of the solenoid clutch 2. A voltage signal $V_1$ and a voltage signal $V_a$ are produced by this circuit.

Figure 2A:
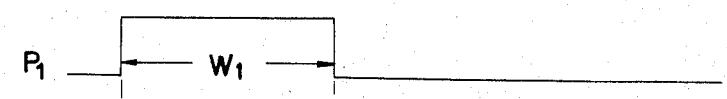
FIGS. 2A to 2E are waveforms of the signals of the controlling circuit shown in FIG. 1.

The voltage signal $V_1$ developed across the resistors 8 and 9 is applied as an engaging command signal to a mono-stable multivibrator 15 formed by OR gates 10 and 11, resistors 12 and 13 and a capacitor 14. The circuit structure of the mono-stable multivibrator 15 is well known. The mono-stable multivibrator 15 is triggered once the level of the input terminal 10a of the OR gate 10 is changed from low to high, whereby the output level of the OR gate 11 becomes high for a predetermined period. Therefore, when the start switch 7 is turned ON with the power switch 4 in closed state, the level of the voltage signal $V_1$ changes from low to high, triggering the mono-stable multivibrator 15 and causing it to produce a first pulse signal $P_1$ with a predetermined pulse width $W_1$ (FIG. 2A).

The first pulse signal $P_1$ is applied to one input terminal of an OR gate 16 which will produce an output voltage $V_o$ in response to the application of the first pulse signal $P_1$. The output voltage $V_o$ is divided by resistors 17 and 18 and the voltage developed across the resistor 18 is applied to the base of the transistor 6. As a result, the transistor 6 is turned ON for a period determined by the pulse width $W_1$ of the first pulse signal $P_1$ when the first pulse signal $P_1$ is produced, and the exciting current flows through the exciting coil 3. A diode D is connected in parallel with the coil 3 for protecting the transistor 6 from the large peak voltage produced in the coil 3 when the transistor 6 is turned OFF.

The pulse width $W_1$ of the first pulse signal $P_1$ is determined taking account of the voltage of the battery 5 in such a way that the width of the gap between the electromagnet 2a and the magnetic plate 2a is reduced to zero by the energy of the first pulse signal $P_1$. As a result, the electromagnet 2a is energized when the start switch 7 is closed to produce the first pulse signal $P_1$, and the level of the first pulse signal $P_1$ becomes low to terminate the exciting operation of the electromagnet 2a by the first pulse signal $P_1$ when the width of the gap between the electromagnet 2a and the magnetic plate 2b has been reduced to zero.

As will be understood from the foregoing description, the mono-stable multivibrator 15 produces a signal for exciting the electromagnet 2a so as to reduce the width of the gap to zero in response to the closing operation of the start switch 7.

In order to drive the solenoid clutch 2 to change it to the completely engaged state from the zero-gap state resulting from the reduction of the gap width to zero by the first pulse signal $P_1$, there is further provided a signal generating circuit 19 for producing a second pulse signal $P_2$ in response to the voltage signal $V_a$. The second pulse signal $P_2$ is applied to another input terminal of the OR gate 16.

Figure 2B:
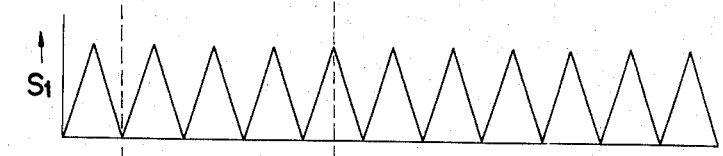
Figure 2C:
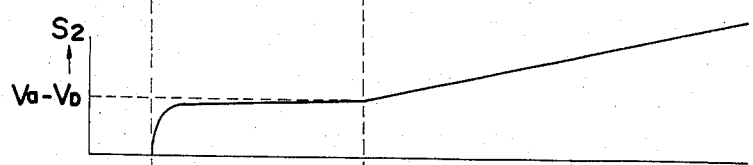

The signal generating circuit 19 has a triangular pulse generator 20 for producing a triangular pulse $S_1$ shown in FIG. 2B, a signal generator 21 for producing a signal $S_2$ whose level varies as shown in FIG. 2C, and a voltage comparator 22 for comparing the triangular pulse $S_1$ in level with the signal $S_2$.

The signal generator 21 includes a series circuit of a resistor 23 and a capacitor 24, which is connected between said other end of the start switch 7 and ground, and a diode 25 connected between the conjunction point A of the resistors 8 and 9 and the conjunction point B of the resistor 23 and the capacitor 24 in the polarity shown in FIG. 1. Furthermore, a diode 26 is connected in parallel with the resistor 23 in the polarity shown in FIG. 1 and the potential appearing at the point B is applied as a signal $S_2$ through a resistor 28 to the non-inverted input terminal of the voltage comparator 22.

The operation of the signal generator 21 will now be described. When the start switch 7 is turned ON at $t_1$, the voltage $V_a$ obtained by dividing the terminal voltage $E_o$ of the battery 5 appears at the point A, and the capacitor 24 is charged through the diode 25 by the voltage $V_a$. Although the capacitor 24 is also charged by the current through the resistor 23 from the battery 5, since the resistance value of the resistor 8 is made sufficiently smaller than that of the resistor 23, the capacitor 24 starts to be rapidly charged by the current flowing through the resistor 8 just after the start switch 7 is closed at $t_1$. The level of the signal $S_2$, that is, the charged voltage level of the capacitor 24 becomes $V_a-V_D$ at $t_2$ when the level of the first pulse signal $P_1$ is changed from high to low. Here, $V_D$ is the value of the voltage drop across the diode 25 in the forward direction. Therefore, since the diode 25 is biased in reverse after $t_2$, the capacitor 24 is charged by the current flowing through the resistor 23 and the level of the signal $S_2$, that is, the level of the potential at the point B increases in accordance with the time constant determined by the values of the resistor 23 and the capacitor 24. The diode 26 serves to provide a discharge path for the capacitor 24 to quickly discharge the voltage of the capacitor 24 when the start switch 7 is turned OFF.

Figure 2D:

The triangular pulse $S_1$ is applied through the resistor 27 to the inverting input terminal of the voltage comparator 22 in which the level of the triangular pulse $S_1$ is compared with that of the signal $S_2$. The output level of the voltage comparator 22 becomes high only when the level of the signal $S_2$ is larger than that of the triangular pulse $S_1$, so that a pulse signal with a waveform as shown in FIG. 2D is derived as a second pulse signal $P_2$ therefrom. The second pulse signal $P_2$ is applied through the OR gate 16 to the base of the transistor 6, and the transistor 6 is turned ON for the high level period of the second pulse signal $P_2$ to energize the electromagnet 2a.

As will be understood from the foregoing description, the duty cycle of the second pulse signal $P_2$ is substantially constant for $t_1 < t < t_2$, and increases with the passage of time after $t_2$. Finally, the duty cycle of the second pulse signal $P_2$ becomes 1.

In this case, the duty cycle of the second pulse signal $P_2$ at $t_2$ is determined in such a way that the electromagnet 2a is excited with energy necessary and sufficient for maintaining the width of the gap at substantially zero.

The operation of the controlling circuit 1 will now be described. At first, when the start switch 7 is turned ON at $t_1$, the mono-stable multivibrator 15 is triggered by the voltage signal $V_1$ to produce the first pulse signal $P_1$ with the pulse width $W_1$ as shown in FIG. 2A. The level of the first pulse signal $P_1$ becomes zero at $t_2$.

Figure 2E:
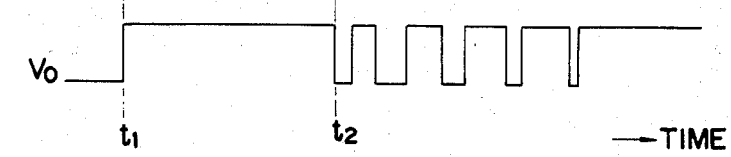

Also in response to the close of the start switch 7, the signal generator 21 produces the signal $S_2$ shown in FIG. 2C in the manner described above, and the second pulse signal $P_2$ shown in FIG. 2D is produced by the comparison of the levels of the signal $S_2$ and the triangular pulse $S_1$. Since the first and second pulse signals $P_1$ and $P_2$ are applied to the respective input terminal of the OR gate 16, the output voltage $V_o$ with the waveform shown in FIG. 2E is produced from the OR gate 16.

As a result, when the start switch 7 is turned ON at $t_1$, the electromagnet 2a is continuously excited from $t_1$ to $t_2$ and the width of the gap of the solenoid clutch 2 is reduced. After the width of the gap becomes zero at $t_2$, the level of the output voltage $V_o$ varies in accordance with the level of the second pulse signal $P_2$, and the slip rate between the input roller 2c and the output roller 2d changes from 1 to 0 as the duty cycle of the second pulse signal $P_2$ increases. As a result, the solenoid clutch 2 is prevented from being instantly engaged, so that no mechanical shock occurs on either the input side or the output side of the solenoid clutch 2 at the time of the engaging operation. Therefore, extremely smooth engagement of the solenoid clutch 2 can be attained.

In this embodiment, the period of time required for the width of the gap to be reduced to zero after the level of the first pulse signal $P_1$ becomes high is determined experimentally in advance, and the width of the output pulse from the mono-stable multivibrator 15 is set on the basis of the experimental data. However, the controlling circuit 1 may be modified in such a way that the time when the width of the gap is reduced to zero is detected on the basis of the change in the waveform of the current flowing through the coil 3 which occurs just when the width of the gap has been reduced to zero.

Furthermore, in the embodiment shown in FIG. 1, in order to carry out the engagement of the solenoid clutch without any mechanical shock, after the width of the gap is reduced to zero by the first pulse signal $P_1$, the slip rate of the solenoid clutch is controlled so as to gradually change from 1 to 0 by increasing the duty cycle of the second pulse signal $P_2$ with the passage of time. However, the present invention is not limited to the embodiment shown in FIG. 1 and the control circuit of the present invention can also be realized using analog control.

Figure 3:
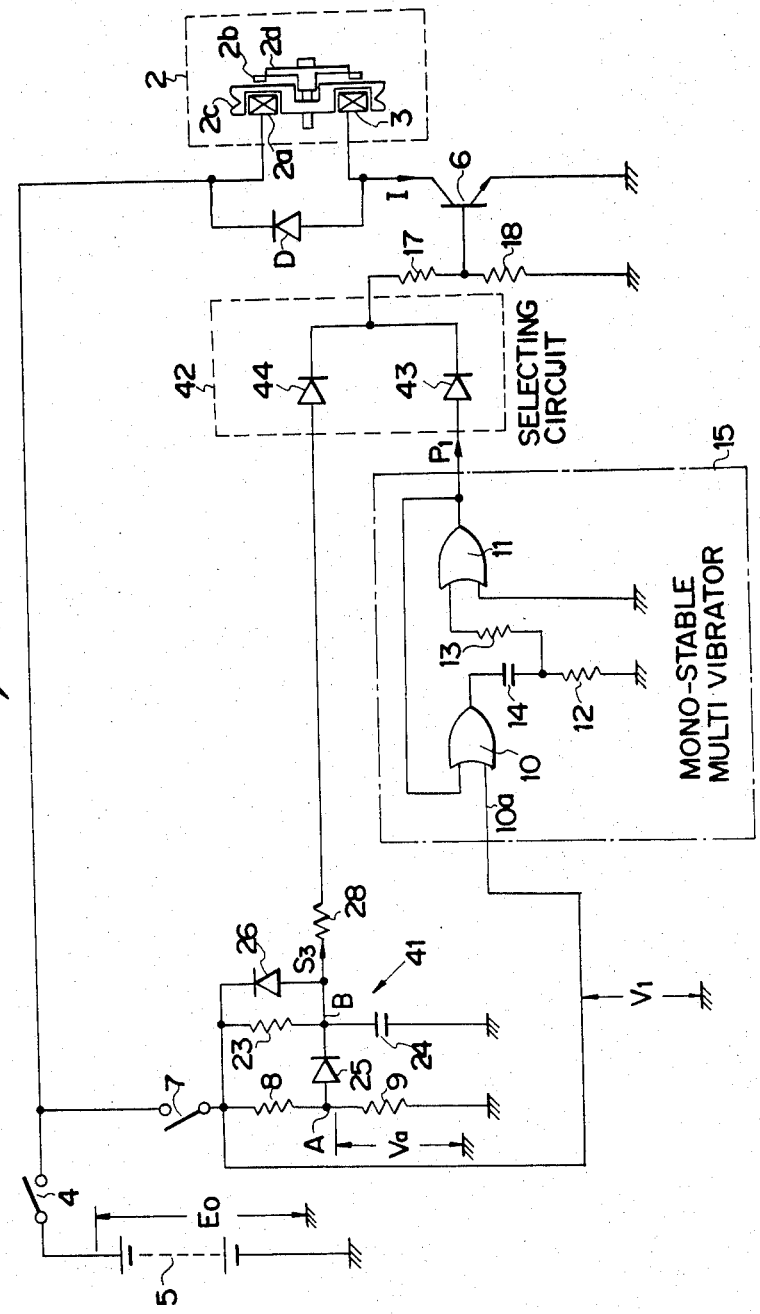
FIG. 3 is a circuit diagram of another embodiment of a circuit for controlling a solenoid clutch according to the present invention.

In FIG. 3, there is shown another embodiment of the circuit for controlling a solenoid clutch according to the present invention. In FIG. 3, the portions corresponding to the portions of FIG. 1 are designated by the same references and explanation thereto will be omitted.

Figure 4A:
FIGS. 4A to 4C are waveforms of the signals of the controlling circuit shown in FIG. 3.

A controlling circuit 40 has a mono-stable multivibrator 15 and a signal generator 41 which is constituted in a similar way to that of the signal generator 21 of FIG. 1. The mono-stable multivibrator 15 produces a first pulse signal $P_1$ with the pulse width $W_1$ whose waveform is shown in FIG. 4A. Similarly to the case of the circuit 1 of FIG. 1, the level of the first pulse signal $P_1$ becomes high at $t_3$ when a start switch 7 is turned ON, and becomes low at $t_4$ when the width of the gap of the solenoid clutch 2 has been reduced to zero. Consequently, the level of the first pulse signal $P_1$ is approximately equal to the voltage $E_o$, and the first pulse signal $P_1$ is applied to a selecting circuit 42 including diodes 43 and 44.

Figure 4B:
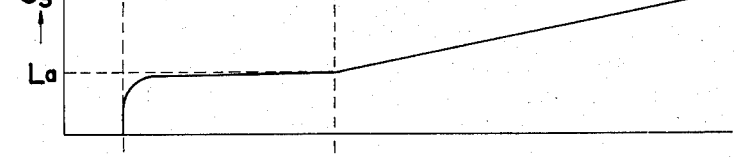

On the other hand, the signal generator 41 produces an analog signal $S_3$ (shown in FIG. 4B) as a main exciting signal in a similar manner to the signal generator 21. Therefore, in the signal generator 41, the same reference numerals as those of the signal generator 21 are used for the respective components. As shown in FIG. 4B, the level of the analog signal $S_3$ from the signal generator 41 is less than that of the first pulse signal $P_1$ between $t_3$ and $t_4$, and gradually increases in accordance with the time constant of the resistor 23 and the capacitor 24 after time $t_4$. The analog signal $S_3$ is applied to the anode of the diode 44 whose cathode is connected to one end of the resistor 17 and the first pulse signal $P_1$ is applied to the anode of the diode 43 whose cathode is connected to the cathode of the diode 44.

Figure 4C:
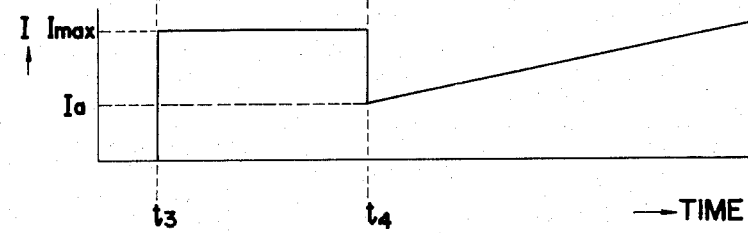

Consequently, the first pulse signal $P_1$ is derived from the selecting circuit 42 between $t_3$ and $t_4$ because during this period the level of the first pulse signal $S_1$ is larger than that of the analog signal $S_3$. The transistor 6 thus becomes fully conductive due to the application of the first pulse signal $P_1$, so that the width of the gap of the solenoid clutch 2 is reduced and becomes zero at $t_4$. The level of the exciting current I flowing through the coil 3 at this time is maximum level ($I_{max}$) as shown in FIG. 4C.

Just after the level of the first pulse signal $P_1$ becomes low at $t_4$, the analog signal $S_3$ of level $L_a$ is applied through the selecting circuit 42 to the resistor 17, whereby the transistor 6 allows the exciting current to flow through the coil 3 at a level $I_a$ which is necessary and sufficient for maintaining the width of the gap at zero. The level of the exciting current I flowing through the coil 3 thereafter gradually increases with the increase in level of the analog signal $S_3$, so that the slip rate of the solenoid clutch 2 gradually changes from 1 to 0. Consequently, as with the circuit 1 shown in FIG. 1, the engaging operation of the solenoid clutch 2 can be smoothly carried out without the occurrence of mechanical shock.

I claim:

1. A circuit for controlling a solenoid clutch which includes an electromagnet and has an input side rotating member and an associated output side rotating member to be engaged with the input side rotating member, the input side rotating member and the output side rotating member being separated by a gap when the solenoid clutch is in the completely disengaged state, said circuit comprising:

a first means for producing at least one command signal for commanding the start of the engagement of said solenoid clutch; and a second means responsive to said command signal for providing an exciting current for said electromagnet whose level is changed in such a way that the width of the gap is first reduced to zero and then the slip rate of said solenoid clutch is gradually changed from 1 to 0.

2. A circuit for controlling a solenoid clutch as claimed in claim 1 wherein said second means has a driving circuit for controlling the level of said exciting current, and a circuit means responsive to said command signal for producing a control signal for controlling said driving circuit so as to obtain an exciting current whose level is changed in such a way that the width of the gap is first reduced to zero and then the slip rate of said solenoid clutch is gradually changed from 1 to 0.

3. A circuit for controlling a solenoid clutch as claimed in claim 2 wherein said first means includes a start switch which is operated at the time of starting the engaging operation of said solenoid clutch and said at least one command signal is produced in response to the operation of said start switch.

4. A circuit for controlling a solenoid clutch as claimed in claim 2 wherein said circuit means has a first pulse generator responsive to said command signal for generating a first pulse signal of a predetermined pulse width, a second pulse generator for generating a second pulse signal whose duty cycle gradually increases with the passage of time in response to the occurrence of said command signal, and means responsive to said first and second pulse signals for obtaining said control signal, whereby the width of the gap is reduced to zero by the exciting current flowing in correspondence with said first pulse signal and then the slip rate of said solenoid clutch changes from 1 to 0 in correspondence with said second pulse signal.

5. A circuit for controlling a solenoid clutch as claimed in claim 4 wherein the pulse width of said first pulse signal is set so that said first pulse signal terminates when the width of the gap has been reduced to zero.

6. A circuit for controlling a solenoid clutch as claimed in claim 5 wherein the duty cycle of said second pulse signal at the termination of said first pulse signal is set so as to supply said electromagnet with exciting energy of a level necessary and sufficient for maintaining the width of the gap at zero.

7. A circuit for controlling a solenoid clutch as claimed in claim 4 wherein said first pulse generator is a mono-stable multivibrator which is triggered by the application of said command signal.

8. A circuit for controlling a solenoid clutch as claimed in claim 4 wherein said second pulse generator has a triangular pulse generator for generating a triangular pulse, a comparison signal generator for generating a comparison signal whose level varies with the passage of time at least after the termination of the first pulse signal and a voltage comparator responsive to the triangular pulse and the comparison signal for comparing the level of the triangular pulse with that of the comparison signal.

9. A circuit for controlling a solenoid clutch as claimed in claim 2 wherein said second means has a first signal generator responsive to said command signal for generating a first signal of a predetermined pulse width, a second signal generator for generating a second signal whose level increases with the passage of time at least after the termination of the first signal and a selecting means for selecting the larger of the first and second signals as the control signal.

* * * * *

Notice of Adverse Decision in Interference

In Interference No. 101,905, involving Patent No. 4,636,912, Y. Ohtani, CIRCUIT FOR CONTROLLING SOLENOID CLUTCH, final judgment adverse to the patentee was rendered Nov. 17, 1988, as to claims 1 - 9.
[*Official Gazette February 14, 1989.*]